United States Patent
Watanabe et al.

(10) Patent No.: US 10,644,667 B2
(45) Date of Patent: May 5, 2020

(54) SOUND PROCESSING DEVICE, SOUND CONTROL DEVICE, AND SOUND CONTROL METHOD

(71) Applicant: Panasonic Intellectual Property Management Co., Ltd., Osaka (JP)

(72) Inventors: Kazuhiro Watanabe, Kanagawa (JP); Kazuhiro Uchida, Kanagawa (JP); Seigo Ozaki, Kanagawa (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 33 days.

(21) Appl. No.: 16/137,274

(22) Filed: Sep. 20, 2018

(65) Prior Publication Data
US 2019/0028077 A1    Jan. 24, 2019

Related U.S. Application Data

(63) Continuation of application No. PCT/JP2017/000383, filed on Jan. 10, 2017.

(30) Foreign Application Priority Data

Mar. 28, 2016  (JP) ................ 2016-063566

(51) Int. Cl.
*H03G 3/00* (2006.01)
*H03G 3/30* (2006.01)
(Continued)

(52) U.S. Cl.
CPC ............. *H03G 3/3005* (2013.01); *H03F 1/52* (2013.01); *H03F 3/20* (2013.01); *H03G 3/004* (2013.01);
(Continued)

(58) Field of Classification Search
CPC ............. H03G 2201/103; H03G 3/004; H03G 3/3005; H04R 3/00; H03F 3/20; H03F 1/52
(Continued)

(56) References Cited

U.S. PATENT DOCUMENTS

2006/0103467 A1* 5/2006 Schoenberger ........... H03F 1/52
                                                                330/298
2006/0133002 A1   6/2006 Kanoh et al.
(Continued)

FOREIGN PATENT DOCUMENTS

JP    2000-023300    1/2000
JP    2003-204600    7/2003
(Continued)

OTHER PUBLICATIONS

International Search Report of PCT application No. PCT/JP2017/000383 dated Apr. 11, 2017.

*Primary Examiner* — Ammar T Hamid
(74) *Attorney, Agent, or Firm* — Greenblum & Bernstein, P.L.C.

(57) ABSTRACT

A sound processing device includes an amplifier, a current detector, and a controller. The amplifier amplifies a sound signal to drive a loudspeaker. The current detector detects a value of an electric current flowing into the amplifier. The controller controls whether to supply power to the amplifier based on a predicted current value and the current detected by the current detector. The predicted current value is predicted in accordance with a volume setting and a level of the sound signal.

8 Claims, 4 Drawing Sheets

(51) Int. Cl.
  *H03F 1/52*   (2006.01)
  *H03F 3/20*   (2006.01)
  *H04R 3/00*   (2006.01)
  *H04R 29/00*  (2006.01)

(52) U.S. Cl.
  CPC ......... *H04R 3/00* (2013.01); *H03G 2201/103* (2013.01); *H04R 29/001* (2013.01)

(58) Field of Classification Search
  USPC .................................... 381/102–109; 330/75
  See application file for complete search history.

(56) References Cited

U.S. PATENT DOCUMENTS

| | | | | |
|---|---|---|---|---|
| 2013/0188793 | A1* | 7/2013 | Li | H03G 11/00 |
| | | | | 381/55 |
| 2013/0257533 | A1* | 10/2013 | Krabbenborg | G05F 5/00 |
| | | | | 330/251 |
| 2015/0296293 | A1* | 10/2015 | Hogan | H04R 3/00 |
| | | | | 381/59 |

FOREIGN PATENT DOCUMENTS

| | | |
|---|---|---|
| JP | 2006-180049 | 7/2006 |
| JP | 2008-521289 | 6/2008 |
| JP | 2009-219015 | 9/2009 |
| JP | 2011-146842 | 7/2011 |
| JP | 2012-085040 | 4/2012 |
| JP | 2015-126444 | 7/2015 |

* cited by examiner

SOUND PROCESSING DEVICE, SOUND CONTROL DEVICE, AND SOUND CONTROL METHOD

CROSS-REFERENCE TO RELATED APPLICATIONS

This application is a continuation of the PCT International Application No. PCT/JP2017/000383 filed on Jan. 10, 2017, which claims the benefit of foreign priority of Japanese patent application No. 2016-063566 filed on Mar. 28, 2016, the contents all of which are incorporated herein by reference.

BACKGROUND

1. Technical Field

The present disclosure relates to a sound processing device provided with an amplifier for driving a loudspeaker, and also relates to a sound control device, and a sound control method.

2. Description of the Related Art

A sound reproduction system includes an amplifier for amplifying sound signals, and a loudspeaker for reproducing sounds in accordance with output signals fed from the amplifier. There are cases where flowing of an overcurrent in the amplifier causes a malfunction of the amplifier and/or the loudspeaker, leading to no sound output.

Thus, Japanese Patent Unexamined Publication No. 2009-219015 and Japanese Patent Unexamined Publication No. 2006-180049 (hereinafter referred as Patent Literature 1 and 2) disclose technologies for protecting an amplifier and a loudspeaker in accordance with output voltages of the amplifier.

SUMMARY

The present disclosure is intended to provide a sound processing device, a sound control device, and a sound controlling method each of which is capable of preventing occurrence of a malfunction of an apparatus that include no sound-output from a loudspeaker.

In accordance with an aspect of the present disclosure, a sound processing device includes an amplifier, a current detector, and a controller. The amplifier amplifies a sound signal to drive a loudspeaker. The current detector detects a value of a current that flows into the amplifier. The controller predicts a predicted current value to flow into the amplifier in accordance with a volume setting for the amplifier and a level of the sound signal, and controls whether to supply power to the amplifier based on the predicted current value and the current detected by the current detector.

In accordance with another aspect of the present disclosure, a sound control device is provided. The sound control device is coupled to an amplifier that amplifies a sound signal to drive a loudspeaker. The sound control device includes a processor and a memory storing a program executed by the processor. The program includes: detecting a value of an electric current flowing into the amplifier; predicting a predicted current value to flow in the amplifier in accordance with a volume setting for the amplifier and a level of the sound signal; and controlling whether to supply power to the amplifier based on the predicted current value and the detected value of the electric current flowing into the amplifier.

In accordance with still another aspect of the present disclosure, a sound controlling method is provided. In the sound controlling method, firstly, a value of an electric current is detected which flows into an amplifier that amplifies a sound signal to drive a loudspeaker. And, a predicted current value to flow in the amplifier is predicted in accordance with a volume setting for the amplifier and a level of the sound signal. Then, whether to supply power to the amplifier is controlled based on the predicted current value and the detected value of the electric current flowing into the amplifier.

With these configuration, whether to supply power to the amplifier is controlled based on the predicted current value of the current flowing into the amplifier; therefore, the control is less prone to be influenced by a time lag, resulting in prevention of occurrence of a malfunction, i.e. no sound-output from the loudspeaker.

DETAILED DESCRIPTION OF PREFERRED EMBODIMENTS

Prior to descriptions of embodiments of the present disclosure, problems of conventional devices will be briefly described. In accordance with Patent Literature 1 and 2, a system is protected based on an output voltage. However, in cases where an overcurrent instantly flows in the system, a protection operation against the overcurrent possibly delays, which causes a malfunction or breakdown of the system, leading to no sound output.

Hereinafter, detailed descriptions of the embodiments will be made with reference to the accompanying drawings as deemed appropriate. However, descriptions in more detail than necessary will sometimes be omitted. For example, detailed descriptions of well-known items and duplicate descriptions of substantially the same configuration may sometimes be omitted, for the sake of brevity and easy understanding by those skilled in the art.

Note that the accompanying drawings and the following descriptions are presented to facilitate fully understanding of the present disclosure by those skilled in the art and, therefore, are not intended to impose any limitations on the subject matter described in the appended claims.

1.1 Configuration

Figure 1:
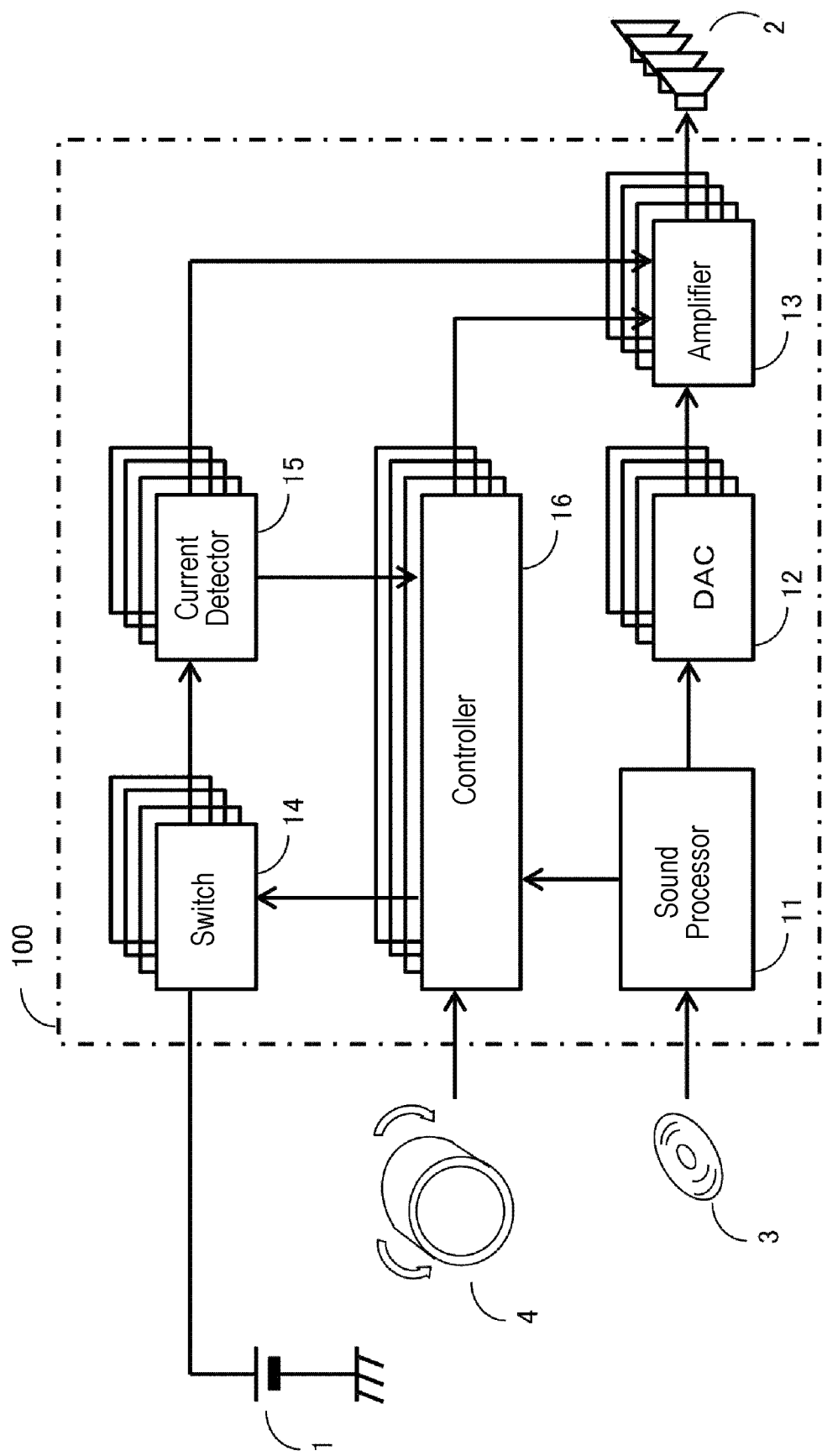
FIG. 1 is a schematic block diagram showing a configuration of a sound processing device according to an embodiment of the present disclosure.

FIG. 1 is a schematic block diagram showing a configuration of sound processing device 100 according to an embodiment of the present disclosure. Sound processing device 100 is mounted to a vehicle, for example. Sound processing device 100 is supplied with electric power from battery power supply 1, and causes one or a plurality of loudspeakers 2 to reproduce sounds. The number of loudspeakers 2 is not particularly limited. However, in the embodiment, a case is assumed, as an example, where four loudspeakers 2 are mounted at a right-front, a left-front, a right-rear, and a left-rear position of the interior of the vehicle.

Sound processing device 100 includes amplifier 13, current detector 15, controller 16 serving as a sound control device. Amplifier 13 amplifies a sound signal to drive loudspeaker 2 that is coupled to amplifier 13. Current detector 15 detects an electric current that flows into amplifier 13. Controller 16 controls whether to supply power to amplifier 13, based on a detected current value and a predicted current value that is predicted in accordance with a volume setting and a sound signal level. Sound processing device 100 further includes sound processor 11, digital-to-analog converter (DAC) 12, and switch 14. Note that, in cases where a plurality of loudspeakers 2 is disposed, pluralities of the following elements are disposed. That is, DACs 12, amplifiers 13, switches 14, current detectors 15, and controllers 16 are disposed, on an every-for-each loudspeaker basis. The whole of sound processing device 100 may be housed in one case, for example, which is mounted in a box disposed in the console of the vehicle. Alternatively, the configuration may be as follows: Of the elements of sound processing device 100, sound processor 11, DAC 12, and controller 16 are housed in a case that is mounted in the box, while amplifier 13, switch 14, and current detector 15 are housed in another case. It is noted, however, that the configurations shown in FIG. 1 and described above are nothing more than typical examples and that they may adopt various modes of configuration in response to actual usages.

Sound processor 11 is a digital signal processor (DSP), for example, which processes a digital signal read from sound source 3, such as an optical disc, to generate sound data as well as a processed digital sound signal. That is, sound processor 11 controls loudness and tone of the digital signal. The digital signal includes a voice signal and a music signal. Moreover, it is sufficient for the sound data to contain information on at least a level of the digital sound signal concerned. Alternatively, the sound data may be the digital sound signal itself. In cases where a plurality of loudspeakers 2 is used to reproduce sounds, sound processor 11 generates a corresponding digital sound signal and corresponding sound data, for each of loudspeakers 2.

Each of DACs 12, being coupled to sound processor 11, converts the thus-generated digital sound signal into an analog sound signal, and then supplies it to corresponding amplifier 13. Note that in cases where amplifier 13 is capable of both amplifying the digital sound signal and outputting it as an analog signal, DACs 12 are not needed.

Each of amplifiers 13 is a power amplifier, for example, which operates with electric power that is supplied from battery power supply 1. Each of amplifiers 13, being coupled to corresponding DAC 12, amplifies the analog sound signal and supplies the resulting voltage to corresponding loudspeaker 2, thereby driving corresponding loudspeaker 2. The thus-supplied voltage causes corresponding loudspeaker 2 to reproduce sounds. However, when no electric power is supplied to amplifier 13, amplifier 13 cannot supply the voltage to loudspeaker 2. Moreover, amplifier 13 may be provided with a mute function. When the mute function is enabled in response to a mute control signal fed from controller 16, amplifier 13 does not supply any voltage to loudspeaker 2.

Each of switches 14 is configured with a circuit including a power transistor, for example. Each of switches 14 is disposed between battery power supply 1 and corresponding amplifier 13. Each of switches 14, being coupled to corresponding controller 16, switches between ON and OFF of power supply from battery power supply 1 to corresponding amplifier 13, in response to a power control signal fed from controller 16. That is, when switch 14 is turned ON, power is supplied from battery power supply 1 to amplifier 13; when switch 14 is turned OFF, power supplied to amplifier 13 is shut off.

Each of current detectors 15 is configured with a resistor that is disposed in series in the power supply line, for example. Each of current detectors 15 is disposed between battery power supply 1 and corresponding amplifier 13. That is, each of current detectors 15 is coupled in series to corresponding switch 14. Each of current detectors 15 detects an electric current that flows from battery power supply 1 to corresponding amplifier 13, that is, in other words, it detects a current consumed by corresponding amplifier 13. Corresponding controller 16 is informed of the detected current value.

Each of controllers 16 is configured with a microcomputer, for example. Controllers 16 may be configured with a special-purpose circuit or, alternatively, a general-purpose circuit with software for operating it. Each of controllers 16 performs control of the power supply to corresponding amplifier 13, via corresponding switch 14. More specifically, each of controllers 16 is coupled to corresponding current detector 15. Upon detection of an abnormality of corresponding amplifier 13, controller 16 halts the power supply to amplifier 13, in order to prevent breakdown of loudspeaker 2 and/or amplifier 13. Each of controllers 16 monitors the value of the electric current flowing into corresponding amplifier 13, and determines whether or not the monitored value exceeds a variable threshold to be described later, thereby detecting the abnormality.

In cases where monitoring is made regarding an alternating-current voltage that is supplied from amplifier 13 to loudspeaker 2, some abnormalities are unable to be detected. Such abnormalities include: a malfunction of amplifier 13 itself (in this case, the monitored voltage decreases to a low level); and an occurrence of a large direct-current voltage. No detection of such abnormalities results in continuously supplying of the power to amplifier 13, leading to a possible breakdown of loudspeaker 2.

In accordance with the embodiment, controller 16 monitors the current flowing into amplifier 13, which allows such abnormalities described above to be addressed.

Moreover, when the threshold is a fixed value, such a threshold is difficult to appropriately set. For example, if threshold is set to a low value, it will erroneously cause the detection of a false abnormality in cases where a sound signal is at a high level and the like even without occurrence of any abnormality. This results in a possibility of excessively frequent halts of the power for amplifier 13. In contrast, if threshold is set to a high value, the controller will fail to detect abnormalities such as a layer short of loudspeaker 2 due to a low impedance. This results in continuous supply of the power to amplifier 13, causing a possible breakdown of loudspeaker 2.

On the other hand, in accordance with the embodiment, the threshold is variable and determined by calculation in accordance with a predicted current value. This allows proper detection of abnormalities without being influenced by the level and the like of a sound signal, allowing the control of power supply.

Specifically, each of controllers 16 is coupled to sound processor 11, corresponding switch 14, corresponding current detector 15, and corresponding amplifier 13. Then, controller 16 receives sound data and a detected current value, from sound processor 11 and current detector 15, respectively. Moreover, controller 16 accepts a volume setting by a user via volume operating unit 4. Note that the volume setting may be performed via any input interface such as a not-shown remote controller or a not-shown touch panel. In general, the volume is set for amplifier 13 in accordance with an amplification degree of amplifier 13.

Moreover, each of controllers 16 may obtain a load of corresponding loudspeaker 2 in advance. Note that, the load of loudspeaker 2 may be a predetermined value or, alternatively, a load that is calculated by controller 16 as follows: For example, sound processor 11 generates a known reference signal (pilot tone). The pilot tone is reproduced with loudspeaker 2, which causes flowing of a current. The value of the current is measured by current detector 15. Controller 16 may use the measured value of the current to calculate the load. With this configuration, even in cases where loudspeaker 2 is an external one, controller 16 can obtain the load of loudspeaker 2 accurately.

Thus, each of controllers 16 sets a variable threshold, in consideration of the load of loudspeaker 2 as well as the level of the sound signal and the volume setting, which thereby allowing the controller to control whether to supply power to corresponding amplifier 13. Moreover, each of controllers 16 compares the detected current value with the variable threshold, and thereby generates both a power control signal to be inputted to corresponding switch 14 and a mute control signal to be inputted to corresponding amplifier 13.

Figure 2:
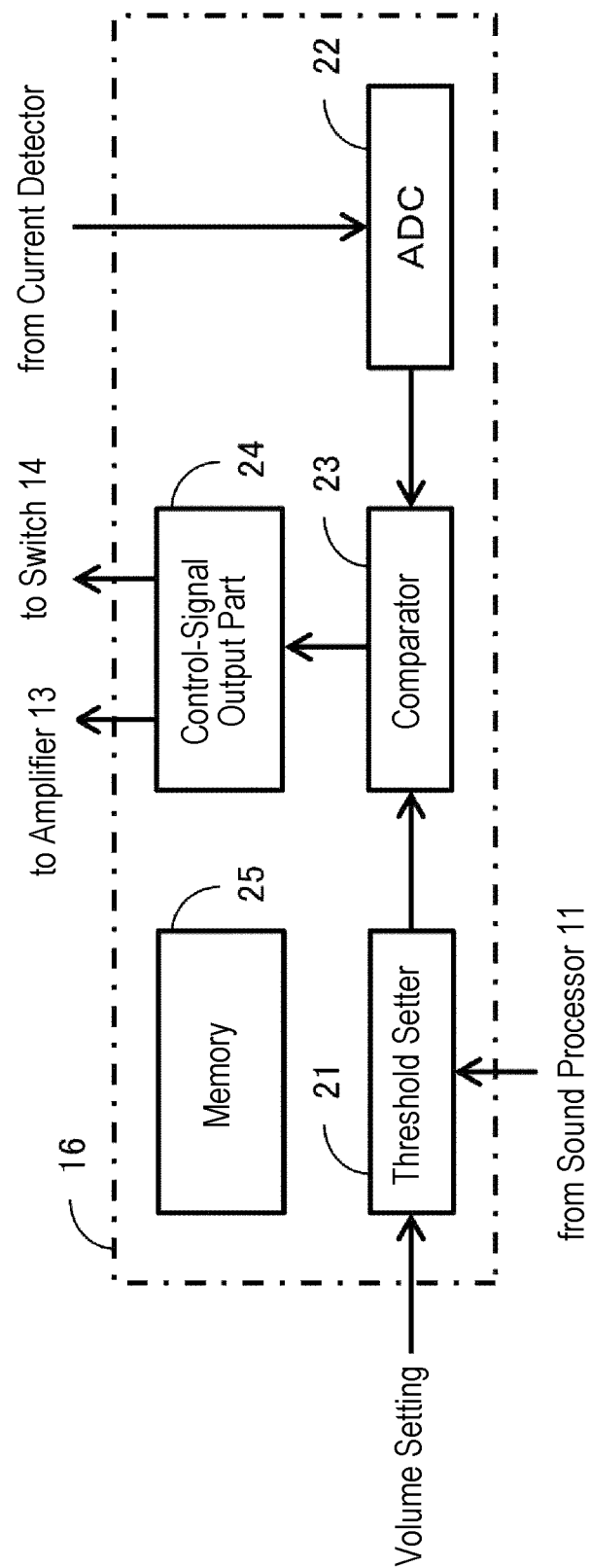
FIG. 2 is a block diagram showing a configuration of a controller of the sound processing device shown in FIG. 1.

FIG. 2 is a block diagram showing a configuration of controller 16. Controller 16 includes threshold setter 21, analog-to-digital converter (ADC) 22, comparator 23, control-signal output part 24, and memory 25. In controller 16, at least one of the constituent elements may be implemented by executing a predetermined program by a processor.

First, threshold setter 21 predicts a voltage (referred to as an output voltage, hereinafter), which is expected to be output from amplifier 13, in accordance with the volume setting and the sound data fed from sound processor 11. That is, threshold setter 21 calculates an output voltage in proportion to the product of the volume determined from the volume setting, the level of the sound signal determined from the sound data, and the amplification degree of amplifier 13 itself which has been obtained in advance. Next, threshold setter 21 predicts a current, which is expected to flow into amplifier 13, by dividing the output voltage by the load of loudspeaker 2. In this way, threshold setter 21 predicts the current which is expected to flow into amplifier 13, in accordance with the level of the sound signal at a stage prior to amplifier 13, without use of the output of amplifier 13. Then, threshold setter 21 sets a threshold (first threshold) that is larger than the thus-predicted current value, by adding a predetermined value to the thus-predicted current value, for example. The thus-set first threshold is fed to comparator 23.

Here, detailed descriptions are made regarding the configuration in which the first threshold is a variable value depending on the volume and the level of the sound signal.

Figure 3A:
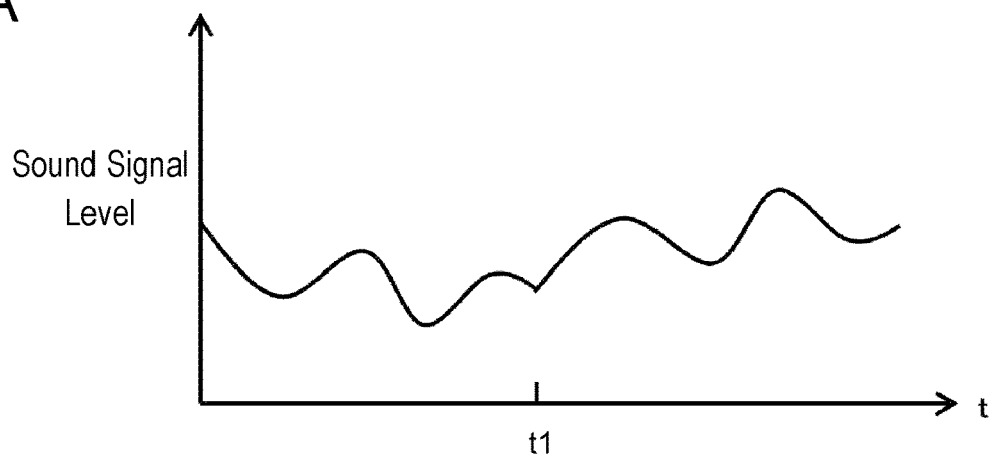
FIG. 3A is a graph showing an example of the level of a sound signal.
Figure 3B:
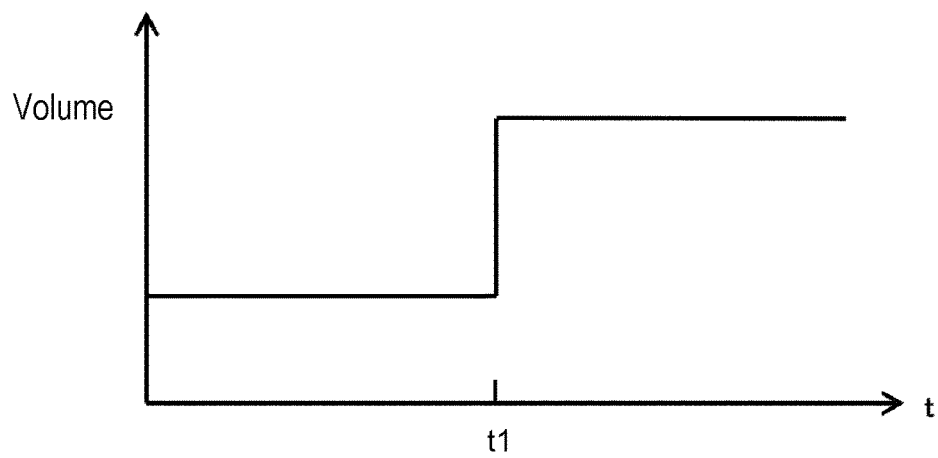
FIG. 3B is a graph showing an example of a volume setting.
Figure 3C:
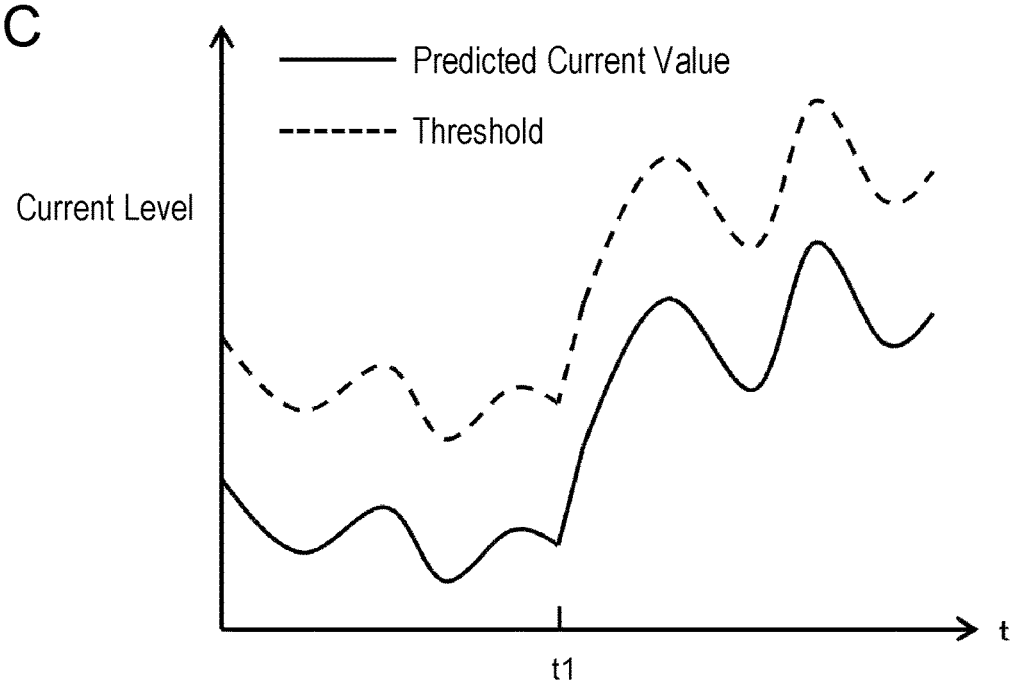
FIG. 3C is a graph illustrating a variable threshold that is determined in accordance with the sound signal shown in FIG. 3A and the volume setting shown in FIG. 3B.

FIGS. 3A to 3C are graphs illustrating a variable threshold. Each horizontal axis indicates time. The vertical axis of FIG. 3A indicates the level of a sound signal that is determined from sound data. The vertical axis of FIG. 3B indicates a volume that is determined from a volume setting. The vertical axis of FIG. 3C indicates both the level (solid line) of a predicted value of current which is expected to flow into amplifier 13 and the level (dashed line) of a variable threshold which is set.

As shown in FIG. 3A, the level of the sound signal changes every moment. Then, as shown in FIG. 3B, a case is assumed where a user increases the volume at time t1. The current that flows into amplifier 13 changes as indicated by the solid line shown in FIG. 3C because it is in proportion to the product of the level of the sound signal and the volume. As a result, the thus-set first threshold is not a fixed value but changes in accordance with the level of the sound signal and the volume, as indicated by the dashed line shown in FIG. 3C.

Note that controller 16 may acquire the level of the sound signal by sampling at any rate. As a preferable example, controller 16 may acquire the level of the sound signal every 10 ms, and set the first threshold every 10 ms.

In this way, in the embodiment, the first threshold is dynamically set in accordance with the level of the sound signal. Therefore, the first threshold can be set flexibly in a stepless manner, one for every amplifier 13 corresponding to each of loudspeakers 2.

As shown in FIG. 2, ADC 22 converts the analog current value fed from current detector 15 into a digital current value. Comparator 23 compares the digital current value fed from ADC 22 with the first threshold fed from threshold setter 21, and informs control-signal output part 24 of the result of the comparison.

Control-signal output part 24 generates a power control signal and a mute control signal in accordance with the result of the comparison, and outputs the resulting signals to corresponding switch 14 and corresponding amplifier 13, respectively. More specifically, when the digital current value is equal to or less than the first threshold, control-signal output part 24 determines that there is nothing abnormal, and generates both a power control signal for causing amplifier 13 to be supplied with power and a mute control signal for causing amplifier 13 not to be muted. On the contrary, when the digital current value exceeds the first threshold, control-signal output part 24 determines that there is something abnormal, and generates both a power control signal for halting the power supply to amplifier 13 and a mute control signal for muting amplifier 13.

As described above, when the digital current value exceeds the first threshold, each of controllers 16 halts the power supply to corresponding amplifier 13, thereby preventing corresponding loudspeaker 2 from being supplied with voltage. When an abnormality is detected, the occurrence of the abnormality is recorded in memory 25.

1.2 Operation

Figure 4:
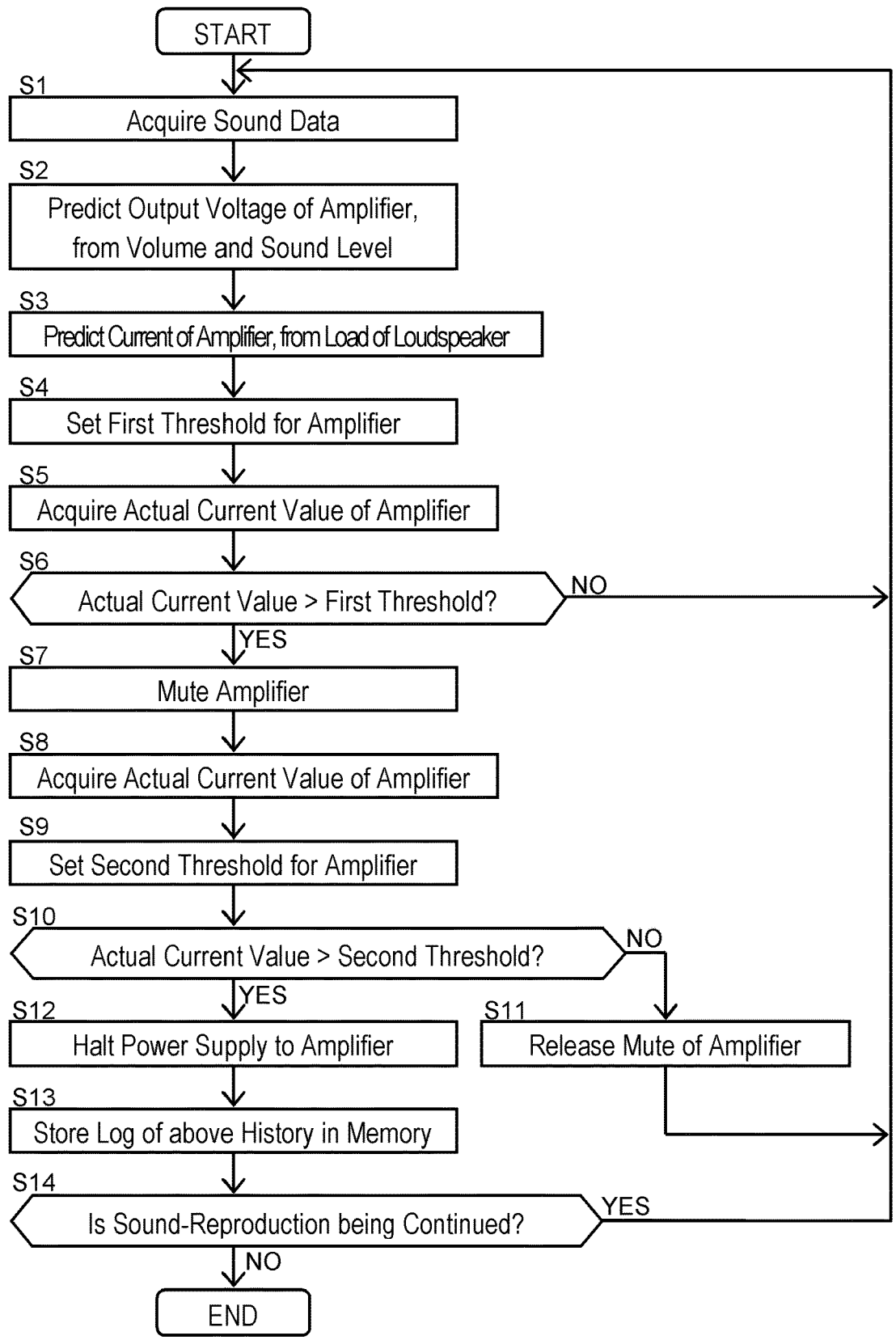
FIG. 4 is a flowchart showing a processing operation of the controller shown in FIG. 2.

FIG. 4 is a flowchart showing a processing operation of each of controllers 16. Note that, in threshold setter 21 of controller 16, there are set a volume, a load of loudspeaker 2, and an amplification degree (fixed value) of amplifier 13 in advance. In addition, assume an initial state in which amplifier 13 is being supplied with power and subjected to no mute operation.

Threshold setter 21 of each of controllers 16 acquires sound data from sound processor 11 (Step S1). Then, threshold setter 21 predicts an output voltage of corresponding amplifier 13, in accordance with the volume, the level of the sound data, and the amplification degree of corresponding amplifier 13 (Step S2). Next, threshold setter 21 predicts a current that is expected to flow into corresponding amplifier 13, in accordance with the output voltage and the load of corresponding loudspeaker 2 (Step S3). Then, threshold setter 21 sets a first threshold that is determined from the thus-predicted current value (Step S4).

Moreover, ADC 22 of each of controllers 16 converts the current value detected by corresponding current detector 15 into a digital current value, thereby acquiring the value (referring to as the actual current value, hereinafter) of the electric current that actually flows into corresponding amplifier 13 (Step S5). Then, comparator 23 compares the actual current value of the electric current flowing into corresponding amplifier 13 with the first threshold that has been set in Step 4 (Step S6).

When the actual value of the current flowing into amplifier 13 is not larger than the first threshold (NO, in Step S6), controller 16 determines that there is nothing abnormal, so that controller 16 continues to supply power to corresponding amplifier 13. More specifically, control-signal output part 24 outputs a power control signal for causing the power supply to amplifier 13. Then, the operation returns to Step S1.

When the actual value of the current flowing into amplifier 13 is larger than the first threshold (YES, in Step S6), controller 16 determines that there is something abnormal, so that control-signal output part 24 generates a mute control signal for causing amplifier 13 to be muted. This operation causes amplifier 13 to be muted (Step S7) such that voltage is not supplied to loudspeaker 2, which thereby prevents loudspeaker 2 from being damaged.

ADC 22 acquires the actual value of the current flowing into amplifier 13 in a state where amplifier 13 is muted (Step S8). Comparator 23 has in advance obtained the value of a consumed current of amplifier 13 in a state where amplifier 13 is normally muted without any fault. Comparator 23 adds a predetermined value to the consumed-current value in the state of mute, thus sets the resulting value as a second threshold (Step S9). Then, comparator 23 compares, again, the actual current value of the current flowing into amplifier 13 with the second threshold (Step S10).

When the actual current value is equal to or less than the second threshold (NO, in Step S10), controller 16 determines that there is nothing abnormal, so that control-signal output part 24 generates a mute control signal for releasing the state of being muted. With this operation, amplifier 13 is released from being muted (Step S11). Then, the operation returns to Step S1.

On the other hand, when the actual current value still continues to exceed the second threshold (YES, in Step S10), control-signal output part 24 generates a power control signal for halting the power supply to amplifier 13. With this operation, switch 14 corresponding to amplifier 13 is turned off to halt the power supply (Step S12). Then, either comparator 23 or control-signal output part 24 records, in memory 25, a log of the occurrence of abnormality (Step S13). The processing operation described above is repeated during the continuation of reproduction of the sound signal (Step S14).

Note that Steps S7 to S11 are processing that is performed in consideration of the possibility that abnormality is erroneously detected in spite of no-occurrence of abnormality. As long as it is caused by erroneous detection, even though an actual current value temporarily exceeds the first threshold (YES, in Step S6), such an actual current value should soon decrease to not larger than the threshold (NO, in Step S10). For this reason, when the actual current value exceeds the first threshold, such an incident is preferably addressed in such a manner that amplifier 13 is not immediately subjected to a halt to power supply, but is temporarily muted. In cases, however, where such the possibility of erroneous detection is not taken into consideration, Steps S7 to S11 may be omitted such that the power supply to amplifier 13 is immediately halted (Step S12) whenever the actual current value exceeds the first threshold (YES, in Step S6). In these cases, the mute control signal as well is not needed.

Moreover, in Step S7, each of controllers 16 individually controls the mute function of corresponding amplifier 13, so that controller 16 mutes only corresponding amplifier 13 when the actual current value exceeds the first threshold. With this operation, loudspeaker 2 which is coupled to another amplifier 13 is allowed to continue reproducing sounds. Likewise, in Step S12, each of controllers 16 individually controls corresponding switch 14, so that controller 16 halts the power supply only to corresponding amplifier 13 when the actual current value keeps exceeding the second threshold. With this operation, loudspeaker 2 which is coupled to another amplifier 13 is allowed to continue reproducing sounds.

It is noted, however, that amplifier 13 and current detector 15 may configure a group and that one controller 16 may individually control a plurality of the groups, thereby driving a plurality of loudspeakers 2. In this case, controller 16 may include a plurality of groups of the constituent elements shown in FIG. 2. Hereinafter, in accordance with this configuration, the operation shown in FIG. 4 is described.

In controller 16, each of the plurality of threshold setters 21 acquires sound data from sound processor 11 (Step S1). Then, each of threshold setters 21 predicts an output voltage of corresponding amplifier 13, in accordance with the volume, the level of the sound data, and the amplification degree of corresponding amplifier 13 (Step S2). Next, each of threshold setters 21 predicts a current that is expected to flow into corresponding amplifier 13, in accordance with the output voltage and the load of corresponding loudspeaker 2 (Step S3). Then, each of threshold setters 21 sets a first threshold that is determined from the thus-predicted current value (Step S4).

Moreover, in controller 16, each of the plurality of ADCs 22 converts the current value detected by corresponding current detector 15 into a digital current value, thereby acquiring the current value (referring to as the actual current value, hereinafter) of the electric current that is actually flowing into corresponding amplifier 13 (Step S5). Then, each of the plurality of comparators 23 compares the actual current value of the electric current flowing into corresponding amplifier 13 with the first threshold that has been set in Step 4 (Step S6).

In accordance with the configuration, when the actual value of electric current flowing into every amplifier 13 is not larger than the first threshold (NO, in Step S6), controller 16 determines that there is nothing abnormal, so that controller 16 continues the power supply to all amplifiers 13. More specifically, each of the plurality of control-signal output parts 24 outputs a power control signal for causing the power supply to corresponding amplifier 13. Then, the operation returns to Step S1.

When the actual value of the electric current flowing into any of amplifiers 13 is larger than the first threshold (YES, in Step S6), controller 16 determines that there is something abnormal, so that corresponding control-signal output part 24 generates a mute control signal for muting amplifier 13 into which the current larger than the first threshold is flowing. This operation causes corresponding amplifier 13 to be muted (Step S7) such that voltage is not supplied to corresponding loudspeaker 2, which thereby prevents loudspeaker 2 from being damaged.

Corresponding ADC 22 acquires the actual current value of the current flowing into amplifier 13 having been muted (Step S8). Corresponding comparator 23 has in advance obtained the value of a consumed current of corresponding amplifier 13 in a state of corresponding amplifier 13 being normally muted without any fault. Corresponding comparator 23 adds a predetermined value to the consumed-current value in the state of mute having been obtained in advance, and sets the resulting value as a second threshold (Step S9). Then, corresponding comparator 23 compares, again, the actual current value of the current flowing into corresponding amplifier 13 with the second threshold (Step S10).

When the actual current value is equal to or less than the second threshold (NO, in Step S10), controller 16 determines that there is nothing abnormal, so that corresponding control-signal output part 24 generates a mute control signal for releasing the state of being muted. With this operation, muted amplifier 13 is released from being muted (Step S11). Then, the operation returns to Step S1.

On the other hand, when the actual current value still continues to exceed the second threshold (YES, in Step S10), corresponding control-signal output part 24 generates a power control signal for halting the power supply to amplifier 13 having been muted. With this operation, switch 14 corresponding to amplifier 13 is turned off to halt the power supply (Step S12). Then, either comparator 23 or control-signal output part 24 records, in corresponding memory 25, a log of the occurrence of abnormality (Step S13). The processing operation described above is repeated during the continuation of reproduction of the sound signal (Step S14).

Note that, in Step S7, controller 16 individually controls the mute functions of the plurality of amplifiers 13. That is, controller 16 mutes only one or more amplifiers 13 into which the actual current values of the electric currents flowing exceed the first threshold, and causes the other amplifiers 13 to be not muted. With this operation, loudspeakers 2 coupled to the other amplifiers 13 are allowed to continue reproducing sounds. Likewise, in Step S12, controller 16 individually controls the plurality of switches 14. That is, controller 16 halts the power supply only to amplifier 13 into which the actual current value of the electric current flowing keeps exceeding the second threshold. The other amplifiers 13 are allowed to continue being supplied with power. With this operation, loudspeakers 2 coupled to the other amplifiers 13 are allowed to continue reproducing sounds.

1.3 Advantages and Others

As described above, in the present embodiment, a current expected to flow into amplifier 13 is predicted in accordance with the level of a sound signal to be input to amplifier 13. Therefore, when the level of the sound signal becomes high, the threshold (first threshold) becomes high. For this reason, even in cases where the output voltage of amplifier 13 becomes so high within the range of its normal operation that the current value of the current flowing into amplifier 13 becomes large, such a high threshold can prevent occurrence of a malfunction, such as no sound output due to a halt to power-supply or a muting operation. Moreover, the control is performed not based on the output of amplifier 13. Instead of this, the abnormality is predicted in accordance with the level of the sound signal to be input to amplifier 13, which can prevent a malfunction due to a time lag from occurring.

Moreover, because the aforementioned embodiments are used only for the exemplification of the technology disclosed herein, it is to be understood that various changes and modifications, replacements, additions, omissions, and the like may be made to the embodiments without departing from the scope of the appended claims or the scope of their equivalents.

As described above, sound processing device 100 includes amplifier 13, current detector 15, and controller 16 serving as the sound control device. Amplifier 13 amplifies a sound signal to drive loudspeaker 2 that is coupled to amplifier 13. Current detector 15 detects a value of a current that flows into amplifier 13. Controller 16 controls whether to supply power to amplifier 13, based on the detected value of the current and the predicted current value that is predicted in accordance with the volume setting and the level of the sound signal.

Specifically, controller 16 may calculate a first threshold in accordance with the volume setting and the level of the sound signal, and then control whether to supply power to amplifier 13, based on the result of a comparison between the first threshold and the detected current. In this case, it is possible to set the proper first threshold in accordance with the volume setting and the level of the sound signal.

Sound processing device 100 may include a plurality of amplifiers 13, and a plurality of current detectors 15 that are disposed corresponding to respective amplifiers 13. In this case, based on the detected current detected by each of the plurality of current detectors 15, controller 16 individually controls the plurality of amplifiers 13 as to whether to supply power to the corresponding one of the plurality of amplifiers 13. With this operation, even if one of amplifiers 13 is not supplied with power, another amplifier 13 is allowed to be supplied with power, which thereby prevents the output sound from being completely off.

Controller 16 preferably controls whether to supply power to amplifier 13 in consideration with the load as well of loudspeaker 2. In this case, controller 16 may acquire the load of loudspeaker 2 in accordance with current that flows into amplifier 13 when amplifier 13 amplifies a known reference signal. With this configuration, even in cases where loudspeaker 2 is not a known one but an external one, the load of loudspeaker 2 can be acquired accurately.

Controller 16 may mute amplifier 13 based on the volume setting, the level of the sound signal, and the detected value of the current. More specifically, controller 16 calculates a first threshold in accordance with the volume setting and the level of the sound signal, and mutes amplifier 13 when the detected value of the current exceeds the first threshold. After that, the controller sets a second threshold in accordance with a value of current that flows into amplifier 13 when amplifier 13 is being muted. Then, when the detected value of the current becomes not larger than the second threshold, controller 16 releases amplifier 13 from being muted. When the detected value of the current keeps exceeding the second threshold, controller 16 halts the power supply to amplifier 13. Controller 16 may operate in this way. With this configuration, temporary muting of amplifier 13 prior to a halt to power supply to amplifier 13 allows a confirmation to be made as to the presence and absence of faults, resulting in the prevention of malfunctions.

The sound processing device, sound control device, and sound controlling method according to the present disclosure are useful in view of protection of loudspeakers.

What is claimed is:

1. A sound processing device, comprising:
a first amplifier configured to amplify a sound signal to drive a first loudspeaker;
a first current detector configured to detect a value of a first electric current flowing into the first amplifier; and
a controller configured to:
predict a first predicted current value to flow into the first amplifier in accordance with a volume setting for the first amplifier and a level of the sound signal;
control whether to supply power to the first amplifier based on the first predicted current value and the value of the first electric current;

determine whether to mute the first amplifier based on the volume setting for the first amplifier, the level of the sound signal, and the value of the first electric current;

calculate a first threshold in accordance with the volume setting for the first amplifier and the level of the sound signal;

mute the first amplifier when the value of the first electric current exceeds the first threshold;

set a second threshold in accordance with a value of the first electric current flowing into the first amplifier being muted;

release the first amplifier from being muted when the value of the first electric current detected by the first current detector becomes not larger than the second threshold; and halt the power supplied to the first amplifier when the value of the first electric current keeps exceeding the second threshold.

2. The sound processing device according to claim 1, wherein the controller is configured to control whether to supply the power to the first amplifier, in consideration of a load of the first loudspeaker.

3. The sound processing device according to claim 2, wherein the controller is configured to calculate the load of the first loudspeaker in accordance with a value of the first electric current flowing into the first amplifier when the first amplifier amplifies a known reference signal.

4. A sound processing device, comprising:
a first amplifier configured to amplify a sound signal to drive a first loudspeaker;
a second amplifier configured to be connected to a second loudspeaker;
a first current detector configured to detect a value of a first electric current flowing into the first amplifier;
a second current detector configured to detect a value of a second electric current flowing into the second amplifier; and
a controller configured to:
predict a first predicted current value to flow into the first amplifier in accordance with a volume setting for the first amplifier and a level of the sound signal;
control whether to supply power to the first amplifier based on the first predicted current value and the value of the first electric current;
predict a second predicted current value to flow in the second amplifier in accordance with a volume setting for the second amplifier and the level of the sound signal;
control whether to supply power to the second amplifier based on the second predicted current value and the value of the second electric current;
determine whether to mute the first amplifier based on the volume setting for the first amplifier, the level of the sound signal, and the value of the first electric current;
determine whether to mute the second amplifier based on the volume setting for the second amplifier, the level of the sound signal, and the value of the second electric current;
calculate a first threshold in accordance with the volume setting for the first amplifier and the level of the sound signal;
mute the first amplifier when the value of the first electric current exceeds the first threshold;
set a second threshold in accordance with a value of the first electric current flowing into the first amplifier being muted;
release the first amplifier from being muted when the value of the first electric current detected by the first current detector becomes not larger than the second threshold;
halt the power supplied to the first amplifier when the value of the first electric current detected by the first current detector keeps exceeding the second threshold;
calculate a third threshold in accordance with the volume setting for the second amplifier and the level of the sound signal;
mute the second amplifier when the value of the second electric current exceeds the third threshold;
set a fourth threshold in accordance with a value of the second electric current flowing into the second amplifier being muted;
release the second amplifier from being muted when the value of the second electric current detected by the second current detector becomes not larger than the fourth threshold; and
halt the power supplied to the second amplifier when the value of the second electric current detected by the second current detector keeps exceeding the fourth threshold.

5. The sound processing device according to claim 4, wherein the controller is further configured to:
calculate a first threshold in accordance with the first predicted current value;
compare the first threshold and the value of the first electric current;
control whether to supply the power to the first amplifier based on a comparison result of the first threshold and the value of the first electric current;
calculate a second threshold in accordance with the second predicted current value;
compare the second threshold and the value of the second electric current; and
control whether to supply the power to the second amplifier based on a comparison result of the second threshold and the value of the second electric current.

6. The sound processing device according to claim 4, wherein the controller is further configured to:
control whether to supply the power to the first amplifier, in consideration of a load of the first loudspeaker; and
control whether to supply the power to the second amplifier, in consideration of a load of the second loudspeaker.

7. A sound control device coupled to an amplifier that amplifies a sound signal to drive a loudspeaker, the sound control device comprising:
a processor; and
a memory storing a program configured to be executed by the processor,
wherein the program, when executed by the processor, causes operations to be performed, the operations including:
detecting a value of an electric current flowing into the amplifier;
predicting a predicted current value to flow in the amplifier in accordance with a volume setting for the amplifier and a level of the sound signal;

controlling whether to supply power to the amplifier based on the predicted current value and the detected value of the electric current flowing into the amplifier;

determining whether to mute the amplifier based on the volume setting for the amplifier, the level of the sound signal, and the value of the electric current;

calculating a first threshold in accordance with the volume setting for the amplifier and the level of the sound signal;

muting the amplifier when the value of the electric current exceeds the first threshold;

setting a second threshold in accordance with a value of the electric current flowing into the amplifier being muted;

releasing the amplifier from being muted when the detected value of the electric current flowing into the amplifier becomes not larger than the second threshold; and halting the power supplied to the amplifier when the detected value of the electric current flowing into the amplifier keeps exceeding the second threshold.

8. A method of controlling sound, the method comprising:

detecting a value of an electric current flowing into an amplifier that amplifies a sound signal to drive a loudspeaker;

predicting a predicted current value to flow in the amplifier in accordance with a volume setting for the amplifier and a level of the sound signal;

controlling whether to supply power to the amplifier based on the predicted current value and the detected value of the electric current flowing into the amplifier;

determining whether to mute the amplifier based on the volume setting for the amplifier, the level of the sound signal, and the value of the electric current;

calculating a first threshold in accordance with the volume setting for the amplifier and the level of the sound signal;

muting the amplifier when the value of the electric current exceeds the first threshold;

setting a second threshold in accordance with a value of the electric current flowing into the amplifier being muted;

releasing the amplifier from being muted when the detected value of the electric current flowing into the amplifier becomes not larger than the second threshold; and halting the power supplied to the amplifier when the detected value of the electric current flowing into the amplifier keeps exceeding the second threshold.

* * * * *